US010340308B1

(12) United States Patent
Schubert et al.

(10) Patent No.: US 10,340,308 B1
(45) Date of Patent: Jul. 2, 2019

(54) DEVICE WITH MULTIPLE VERTICALLY SEPARATED TERMINALS AND METHODS FOR MAKING THE SAME

(71) Applicant: X Development LLC, Mountain View, CA (US)

(72) Inventors: Martin Friedrich Schubert, Mountain View, CA (US); Michael Jason Grundmann, San Jose, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 15/853,388

(22) Filed: Dec. 22, 2017

(51) Int. Cl.
| H01L 27/15 | (2006.01) |
| H05B 33/10 | (2006.01) |
| H05B 33/14 | (2006.01) |
| H05B 33/08 | (2006.01) |
| H05B 33/06 | (2006.01) |
| H01L 33/24 | (2010.01) |
| H05B 33/28 | (2006.01) |

(52) U.S. Cl.
CPC .............. H01L 27/15 (2013.01); H01L 33/24 (2013.01); H05B 33/06 (2013.01); H05B 33/0806 (2013.01); H05B 33/10 (2013.01); H05B 33/145 (2013.01); H05B 33/28 (2013.01)

(58) Field of Classification Search
CPC ......... H01L 33/08; H01L 33/20; H01L 33/24; H01L 27/15; H01L 27/153; H01L 27/156; H05B 33/10; G02B 19/0066
See application file for complete search history.

(56) References Cited

U.S. PATENT DOCUMENTS

| 4,912,533 A * | 3/1990 | Takahashi ............. H01L 27/153 257/103 |
| 5,039,627 A * | 8/1991 | Menigaux ........... H01L 33/0062 148/33.4 |
| 5,583,350 A | 12/1996 | Norman et al. |
| 5,739,552 A * | 4/1998 | Kimura ............... H01L 25/0756 257/103 |

(Continued)

OTHER PUBLICATIONS

Kim et al. "Stretchable, Transparent Graphene Interconnects for Arrays of Microscale Inorganic Light Emitting Diodes in Rubber Substrates," Nano Letters 11(9), Aug. 2011, 22 pages.

(Continued)

*Primary Examiner* — Scott B Geyer
(74) *Attorney, Agent, or Firm* — Fish & Richardson P.C.

(57) ABSTRACT

A light emitting device that includes: a plurality of light emitting elements arranged at different locations in a common plane, each light emitting element including: at least one layer of a semiconductor material; a first electrical terminal located at a first location; a second electrical terminal located at a second location; and a third electrical terminal located at a third location; a first electrode layer including one or more electrodes; a second electrode layer including one or more electrodes; a third electrode layer including one or more electrodes; a first electrically insulating layer disposed between the plurality of light emitting elements and also disposed between the first and second electrode layers; and a second electrically insulating layer disposed between the plurality of light emitting elements and also disposed between the second and third electrode layers.

11 Claims, 9 Drawing Sheets

(56) References Cited

U.S. PATENT DOCUMENTS

| | | | | |
|---|---|---|---|---|
| 6,563,139 | B2* | 5/2003 | Hen | H01L 25/0753 257/79 |
| 7,110,061 | B2* | 9/2006 | Komoto | G02B 6/0023 257/89 |
| 7,935,972 | B2* | 5/2011 | Plank | H01L 25/0756 257/79 |
| 8,283,680 | B2 | 10/2012 | Repetto et al. | |
| 8,624,274 | B2* | 1/2014 | Hsueh | H01L 27/15 257/103 |
| 9,159,700 | B2 | 10/2015 | Sakariya et al. | |
| 2006/0255347 | A1* | 11/2006 | DenBaars | H01L 33/08 257/89 |
| 2011/0095260 | A1* | 4/2011 | Kim | H01L 27/156 257/13 |
| 2014/0367633 | A1 | 12/2014 | Bibl et al. | |
| 2015/0001560 | A1* | 1/2015 | Ryden | H01L 27/153 257/88 |
| 2015/0062949 | A1* | 3/2015 | Lee | F21S 43/26 362/520 |
| 2016/0056345 | A1* | 2/2016 | Park | F21S 43/14 257/88 |
| 2016/0093600 | A1 | 3/2016 | Bower et al. | |
| 2017/0179092 | A1 | 6/2017 | Sasaki et al. | |

OTHER PUBLICATIONS

Radauscher et al. "Miniaturized LEDs for Flat-Panel Displays," SPIE OPTO, Feb. 2017, 11 pages.

Trindade. "Micro-Transfer-Printing for Flexible Passive Matrix Displays Based on Inorganic LEDs," X-Celeprint Ltd, Mar. 30, 2017, [retrieved on Sep. 24, 2018] Retrieved from Internet: URLhttp://semieurope.omnibooksonline.com/2016/semicon_europa/2016FLEX%20Europe/23_Antonio%20Jose%20Trindade_X-Celeprint.pdf> 29 pages.

* cited by examiner

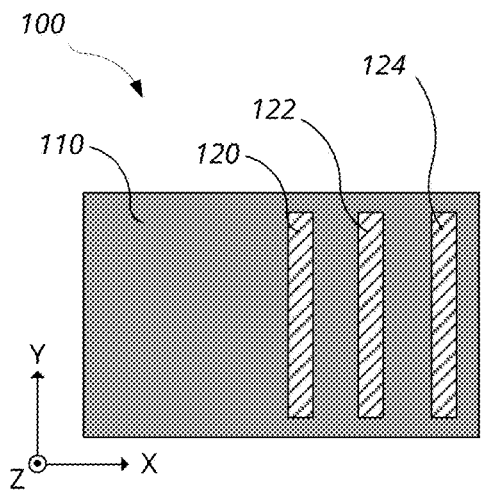
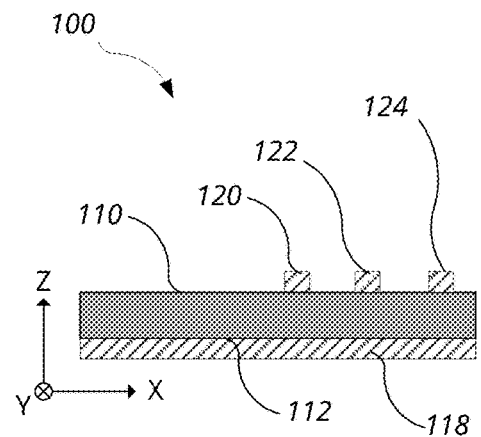
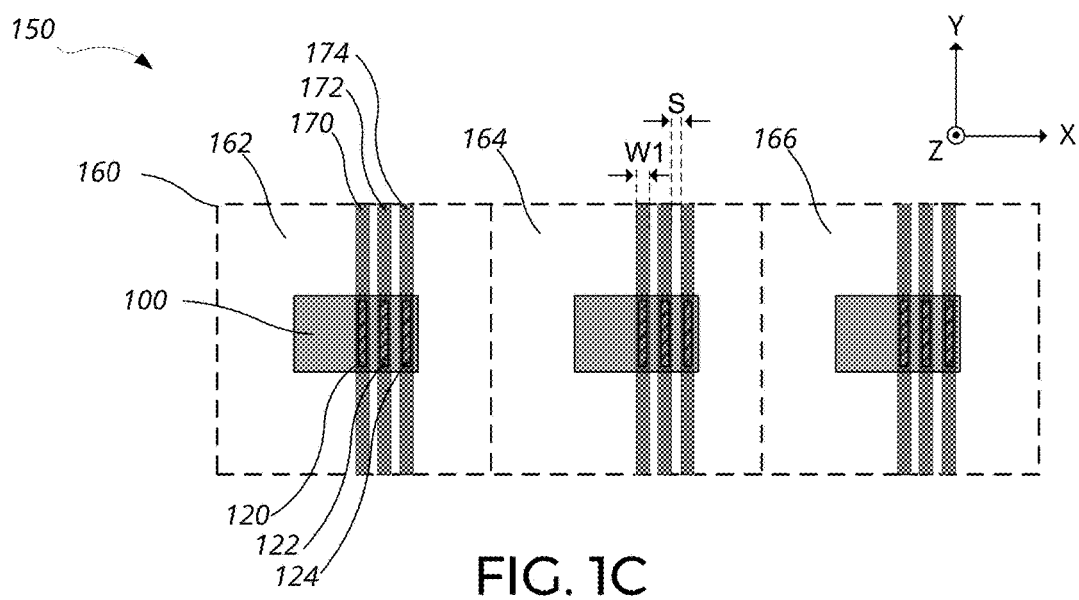
FIG. 1A
FIG. 1B
FIG. 1C

DEVICE WITH MULTIPLE VERTICALLY SEPARATED TERMINALS AND METHODS FOR MAKING THE SAME

TECHNICAL FIELD

This disclosure generally relates to light emitting devices and methods of making the light emitting devices.

BACKGROUND

In its simplest form, a light-emitting diode (LED) is a light source composed of a p-n junction diode that emits light when activated. When a suitable voltage is applied to electrical contacts on opposing sides of the junction, electrons are able to recombine with holes within an active region of the device, releasing energy in the form of photons. The wavelengths of the emitted light and correspondingly, the color of the LED for visible wavelengths, is generally determined by the energy band gap of the semiconductor. LEDs are often small devices (e.g., having an active area of less than 1 mm$^2$) and integrated optical components may be used to shape the radiation pattern.

Generally, LEDs can be formed from inorganic or organic semiconductor materials. An inorganic LED (ILED) is formed using inorganic materials such as compound semiconductors (e.g., InGaAs, InGaN). Compared to organic LEDs (OLEDs) formed using organic materials, ILEDs are capable of generating light at a significantly higher power efficiency at a brightness per unit area that is several orders of magnitude higher (e.g., 1,000×~10,000×) than that of OLEDs.

Due to the high efficiency of ILED devices, extremely small inorganic LEDs can yield sufficient light to be practically useful for applications like displays or general illumination sources. LED dies having active areas of 100 μm$^2$ or less and a thickness of 10 μm or less can generate light visible to the human eye at drive currents on the order of tens of nanoamps. Such devices are often referred to as microLEDs, mLEDs, or AEDs. Generally, μLEDs have an active area in a range from 1 μm$^2$ to about 2500 μm$^2$ and are manufactured using conventional semiconductor manufacturing techniques. As a result, μLEDs can have many different geometries, as specific applications demand.

SUMMARY

This disclosure features devices having electrical contacts on 3 or more vertical levels, and methods for assembling and interconnecting such devices. For certain types of devices, such as μLEDs, device cost is often correlated with surface area, or footprint, of the device. For example, in context of μLEDs, the light emitting surface of the μLED device can be as small as 10 μm×10 μm. However, the actual footprint of the μLED is typically larger to accommodate electrical contacts that would otherwise block portions of the emitted light. A single color μLED has a minimum of 2 contacts, and a 3 color μLED can have 4 or more contacts. As such, lower bound on size of μLEDs is often limited by the area needed by the electrical contacts.

Additionally, assembling a system such as an active matrix display from the μLEDs presents a unique challenge in that 10 μm×10 μm μLEDs would conventionally need to be placed on a substrate with micron-level accuracy, followed by micron-level alignment and patterning of conductors to provide necessary electrical connections to the μLEDs. Such manufacturing complexities generally increases manufacturing cost and may make assembly of such displays infeasible.

To relax tolerance in device placement and conductor patterning, the contacts can be formed on different vertical levels, or tiers. For example, multiple tiers can be formed on a top surface of the device to form a staircase structure. While surface area of contacts at each tier is reduced, the vertical separation and resulting electrical isolation between the contacts now allows placement accuracy to be relaxed. Furthermore, conductors patterning tolerance can be relaxed as well. In fact, the conductors can now be wider than the device itself, as potential for electrical shorting is removed as only a single contact exists on the device at a given tier.

In some implementations, contacts are formed as peripheral "rings" around the perimeter of the device, separated in the vertical direction. Perimeter contacts can allow the top light emitting surface of μLEDs to be maximized by reducing or eliminating portion of the top surface that is blocked by the electrical contacts. Furthermore, because the peripheral contacts are accessible from any in-plane directions, rotational alignment requirement can be relaxed or eliminated altogether when assembling a display from the μLEDs having perimeter contacts.

In general, in a first aspect, the invention features a light emitting device that includes: a plurality of light emitting elements arranged at different locations in a common plane, each light emitting element including: at least one layer of a semiconductor material; a first electrical terminal for providing charge carriers to a first portion of the light emitting element, the first electrical terminal being located at a first location along an axis perpendicular to the common plane; a second electrical terminal for providing charge carriers to a second portion of the light emitting element, the second electrical terminal being located at a second location along the axis perpendicular to the common plane different from the first location; and a third electrical terminal for providing charge carriers to a third portion of the light emitting element, the third electrical terminal being located at a third location along the axis perpendicular to the common plane different from the first and second locations; a first electrode layer including one or more electrodes each being in electrical contact with the first electrical terminal of one or more of the plurality of light emitting elements; a second electrode layer including one or more electrodes each being in electrical contact with the second electrical terminal of one or more of the plurality of light emitting elements; a third electrode layer including one or more electrodes each being in electrical contact with the third electrical terminal of one or more of the plurality of light emitting elements; a first electrically insulating layer disposed between the plurality of light emitting elements and also disposed between the first and second electrode layers along the axis perpendicular to the common plane; and a second electrically insulating layer disposed between the plurality of light emitting elements and also disposed between the second and third electrode layers along the axis perpendicular to the common plane.

Embodiments of the light emitting device can include one or more of the following features. For example, the first electrical terminal, the second electrical terminal, and the third electrical terminal can be contacts that do not spatially overlap when projected onto the common plane. As another example, the first electrical terminal, the second electrical terminal, and the third electrical terminal can be perimeter contacts that cover at least a portion of a sidewall of the light emitting element.

At least one of the one or more electrodes of the first electrode layer, second electrode layer, or the third electrode layer can be a transparent electrode. The transparent electrode can be formed from a material selected from the group consisting of a transparent conducting oxide, transparent conducting polymer, graphene, and carbon nanotube.

The first location, the second location, and the third location adjacent to one another along the axis perpendicular to the common plane can be separated from one another by 1000 nm or less along the axis.

In some embodiments, the light emitting device can further include: an active matrix backplane supporting the plurality of light emitting elements, the first electrode layer, the second electrode layer, the third electrode layer, the first electrically insulating layer, and the second electrically insulating layer. A total area of the plurality of light emitting elements in the common plane can be equal to or less than 15% of an area of the active matrix backplane.

The plurality of light emitting elements can include at least 10,000 light emitting elements.

The one or more electrodes of the first electrode layer, second electrode layer, and the third electrode layer can have widths larger than dimensions of the light emitting elements in the common plane.

In some embodiments, the light emitting device can further include: a plurality of non-light emitting elements arranged at different locations in the common plane, the plurality of non-light emitting elements including at least one of photosensor, voltage driver circuit, current driver circuit, logic circuit, memory, imaging device, acoustic sensor, spectrometer, ultrasonic sensor, or ultrasonic transducer.

In another aspect, the invention features a process for producing a light emitting device, including: placing a plurality of light emitting elements on a surface of a substrate at different locations in a common plane, each light emitting element including: at least one layer of a semiconductor material; a first electrical terminal for providing charge carriers to a first portion of the light emitting element, the first electrical terminal being located at a first location along an axis perpendicular to the common plane; a second electrical terminal for providing charge carriers to a second portion of the light emitting element, the second electrical terminal being located at a second location along the axis perpendicular to the common plane different from the first location; and a third electrical terminal for providing charge carriers to a third portion of the light emitting element, the third electrical terminal being located at a third location along the axis perpendicular to the common plane different from the first and second locations; forming a first electrode layer including one or more electrodes each being in electrical contact with the first electrical terminal of one or more of the plurality of light emitting elements; forming a first electrically insulating layer over the first electrode layer; and forming a second electrode layer including one or more electrodes each being in electrical contact with the second electrical terminal of one or more of the plurality of light emitting elements.

Embodiments of the process can include one or more of the following features and/or features of other aspects. For example, widths of the one or more electrodes of the first electrode layer and the second electrode layer can be larger than a lateral placement accuracy achieved during the placing of the plurality of light emitting elements on the surface of the substrate at different locations in the common plane. As another example, widths of the one or more electrodes of the first electrode layer and the second electrode layer can be larger than dimensions of the light emitting elements in the common plane.

The substrate can be an active matrix backplane plane including a third electrode layer including one or more electrodes each configured to be in electrical contact with the third electrical terminal of one or more of the plurality of light emitting elements, and the process can further include: prior to the forming a first electrode layer, forming a second electrically insulating layer over the third electrode layer.

In some embodiments, the process can further include: prior to the placing a plurality of light emitting elements on a surface of a substrate, forming a third electrode layer including one or more electrodes each being in electrical contact with the third electrical terminal of one or more of the plurality of light emitting elements; and prior to the forming a first electrode layer, forming a second electrically insulating layer over the third electrode layer.

The placing a plurality of light emitting elements on a surface of a substrate can include: performing parallel transfer of the plurality of light emitting elements. The placing a plurality of light emitting elements on a surface of a substrate can include: performing a self-assembly of the plurality of light emitting elements.

In some embodiments, the process can further include: after the placing a plurality of light emitting elements on a surface of a substrate, performing a reflow step to mechanically attach the plurality of light emitting elements on the surface of the substrate.

In some embodiments, the process can further include: placing a plurality of non-light emitting elements on the surface of the substrate at different locations in the common plane, the plurality of non-light emitting elements including at least one of photosensor, voltage driver circuit, current driver circuit, RF circuit, antenna, logic circuit, or memory.

Among other advantages, placement accuracy for µLEDs can be relaxed when assembling a µLED array. Multiple µLEDs can be interconnected using a lower resolution patterning process. Rotational alignment requirement can be reduced or eliminated by using multi-tiered perimeter contact. Footprint of contact area-limited devices can be reduced by implementing multi-tiered contacts.

The details of one or more implementations of the subject matter of this disclosure are set forth in the accompanying drawings and the description below. Other features, aspects, and advantages of the subject matter will become apparent from the description, the drawings, and the claims.

BRIEF DESCRIPTION OF THE DRAWINGS

FIG. 1A shows a top view of an example device with multiple terminals;

FIG. 1B shows a side view of the example device with multiple terminals;

FIG. 1C shows a top view of a portion of an example assembly of the example devices;

Like reference numbers and designations in the various drawings indicate like elements.

DETAILED DESCRIPTION

Figure 2A:
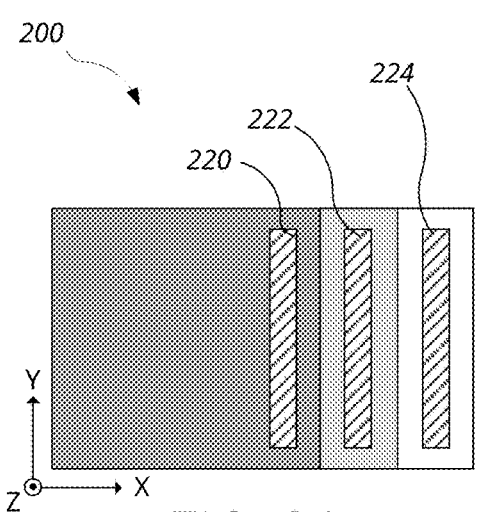
FIG. 2A shows a top view of a first example device with vertically separated terminals.

Referring to FIG. 1A and FIG. 1B, an example device 100 with multiple terminals is shown in top and side view, respectively. Cartesian axes are shown for ease of reference. In this regard, an object's thickness refers to the object's dimension as measured along z-axis. An object's lateral area refers to the object's area in the x-y plane. "Top" and "bottom" refer to the +z and −z directions, respectively. For example, the top surface of device 100 refers to the surface facing in the +z direction, while the bottom surface refers to the opposite surface.

The device 100 has a top surface 110, bottom surface 112, and includes a bottom terminal 118, a first terminal 120, a second terminal 122, and a third terminal 124. For example, the device 100 can be a light emitting element, such as a μLED. The top surface 110 and the bottom surface 112 are generally parallel to one another, and are parallel to the x-y plane in this example. The plane encompassing the bottom surface may be referred to as a "common plane". The top surface, for example, can be a light emitting surface. Additionally, or alternatively, the bottom surface can be a light emitting surface.

The bottom terminal 118 is located along the bottom surface 112 of the device 100. For example, the bottom terminal 118 can be formed continuously across the bottom surface 112. The first, second, and third terminals are located along the top surface 110 of the device 100. Specifically, the terminals 120, 122, and 124 are laterally separated but located at the same height, or same location along the z-axis. The terminals 118, 120, 122, and 124 are in electrical contact with different portions of the device 100, and can apply an electrical voltage, provide charge carriers, or combination thereof to different portions of the device 100. The different portions can correspond to, among others, different circuits, different components of the device, and different layers contained in the device 100. For example, the terminals 120, 122, and 124 can be anodes of three LEDs included in the device 100 emitting light at three different wavelengths, such as red, green, and blue, and the bottom terminal 118 can be a shared cathode for the three LEDs. By providing charge carriers to the LEDs of the device 100, light can be generated.

Referring to FIG. 1C, a top view of a portion of an example assembly 150 of the example devices 100 is shown. The assembly 150 includes a substrate 160, multiple devices 100, first electrodes 170, second electrodes 172, and third electrodes 174. For example, the assembly 150 can be a display device including multiple LED devices 100. The substrate 160 has a first region 162, a second region 164, and a third region 166. While not visible, the substrate also includes bottom electrodes. The regions correspond to placement regions of each of the devices 100, and in case for a display device, can correspond to pixels of the display device.

The devices 100 of the assembly 150 are interconnected by the electrodes 170, 172, and 174. In this example, the first terminal 120 is in electrical contact with the first electrode 170, the second terminal 122 is in electrical contact with the second electrode 172, the third terminal 124 is in electrical contact with the third electrode 174, and the bottom terminal 118 is in electrical contact with the bottom electrode. The electrodes have a width W1, and a separation S between adjacent electrodes. Typically, the terminals 170, 172, and 174 of the device 100 are driven independent of one another, such as to allow independent control of each LEDs of the device 100 to emit light of various colors. As such, the electrodes 170, 172, and 174 should contact only the corresponding terminals and be electrically isolated from one another. To avoid unintended electrical shorts and opens between the terminals and the electrodes, the width W1 and the spacing S should be set to correspond to the geometry of the corresponding terminals. Furthermore, the electrodes 170, 172, and 174 should be aligned to overlap with only the corresponding terminals.

Generally, the relative dimensions of the substrate 160, the regions 162, 164, and 166, the devices 100, and the electrodes 170, 172, and 174 can vary greatly depending on the type and specifics of the assembly 150. For example, for an assembly 150 that is a display device, the substrate 160 can have lateral dimensions ranging from 1 cm to 100's of cm, while the regions 162, 164, and 166 have lateral dimensions ranging from 10's of microns to millimeters. Furthermore, the devices 100 such as μLEDs can have lateral dimensions ranging from a few microns to 10's of microns, and widths of the electrodes 170, 172, and 174 making electrical contact to the terminals of the device 100 can range from microns to 10's of microns to individually contact the laterally separated terminals.

Assembling such a display device having a sparse array of μLED devices 100 placed across the substrate 160 using conventional manufacturing techniques can be challenging for various reasons. One challenge is in placing the devices 100 that are several orders of magnitude smaller than the substrate 160 with sufficient placement accuracy. For example, achieving micron-level placement accuracy over an area of 100's to 10,000's of cm² can be difficult or infeasible, especially for a large number of devices 100, such as 100,000 devices.

Another challenge is in forming the electrodes 170, 172, and 174 over such a large area, and aligning the electrodes to the respective terminals of the device. Typically, the electrodes are formed using photolithography-based patterning processes. Achieving fine resolutions, such as electrodes that are a few microns in width and separated by a few microns, over such a large area can be difficult or infeasible. Furthermore, even if such fine resolution can be achieved, ensuring proper alignment between the electrodes 170, 172, and 174 and the respective terminals of the devices 100 can be difficult or infeasible. Photolithography-based patterning processes are typically performed using a photomasks or stencils that contain a pre-defined layout of the electrodes. As such, not only is the alignment tolerance of the electrode patterns to the substrate 160 at the micron-level, individual devices 100 also need to be aligned at the micron-level with respect to the target location on the substrate to achieve desired electrical connections.

Furthermore, due to process variations that are typical to placement, alignment, and patterning processes, compounding of tight tolerances across various steps can lower manufacturing yield of the assembly 150, which can increase cost of manufacturing or make manufacturing of such assembly 150 difficult or infeasible. As such, techniques for relaxing the tolerances in manufacturing of such assembly 150 are desired.

Figure 2B:
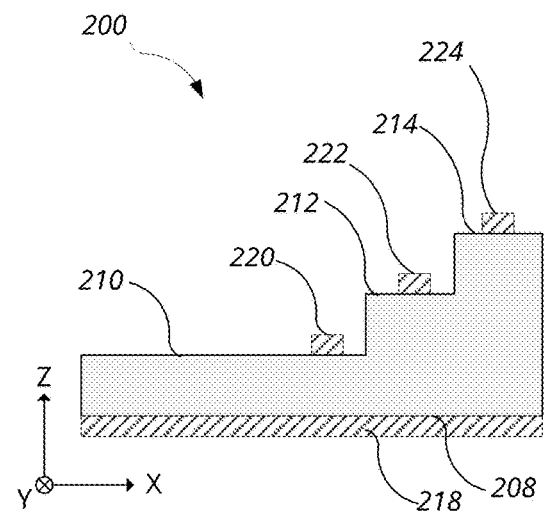
FIG. 2B shows a side view of the first example device with vertically separated terminals.
Figure 2C:
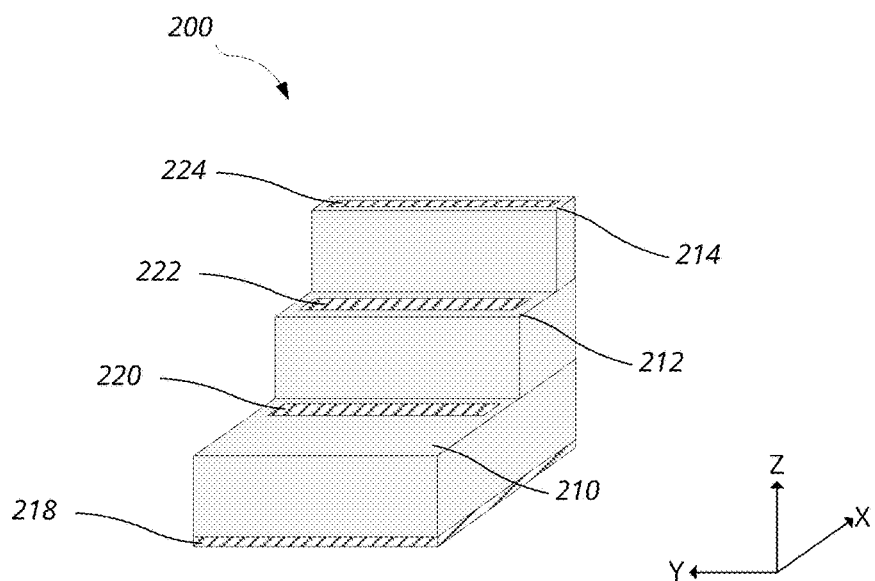
FIG. 2C shows a perspective view of the first example device with vertically separated terminals.

Referring to FIG. 2A-2C, an example device 200 with vertically separated terminals is shown in top, side and perspective view, respectively. The device 200 has a bottom surface 208, a first top surface 210, a second top surface 212, a third top surface 214, and includes a bottom terminal 218, a first terminal 220, a second terminal 222, and a third terminal 224. For example, the device 200 can be a light emitting element, such as a μLED. The top surfaces 210, 212, 214, and the bottom surface 208 are generally parallel to one another, and are parallel to the x-y plane in this example. The plane encompassing the bottom surface is a common plane. The first top surface 210, for example, can be a light emitting surface. Additionally, or alternatively, the bottom surface 208 can be a light emitting surface.

The bottom terminal 218 is located along the bottom surface 208 of the device 200. For example, the bottom terminal 218 can be formed continuously across the bottom surface 208. The first, second, and third terminals 220, 222, and 224 are located along the first, second, and third top surfaces 210, 212, and 214. Specifically, the terminals 220, 222, and 224 are both laterally separated in the x-y plane, and also vertically separated along the z-axis. The vertical separation between adjacent pairs of top surfaces can range, for example, between 100 nm to 10 μm. As another example, the vertical separation between adjacent pairs of top surfaces can be a fraction of the height H of the device 200, such as H/2, H/4, or H/8.

The terminals 218, 220, 222, and 224 are in electrical contact with different portions of the device 200, and can apply an electrical voltage, provide charge carriers, or combination thereof to different portions of the device 200. The different portions can correspond to, among others, different circuits, different components of the device, and different layers contained in the device 200. For example, the terminals 220, 222, and 224 can be anodes of three LEDs included in the device 200 emitting light at three different wavelengths, such as red, green, and blue, and the bottom terminal 218 can be a shared cathode for the three LEDs. By providing charge carriers to the LEDs of the device 200, light can be generated.

Figure 2D:
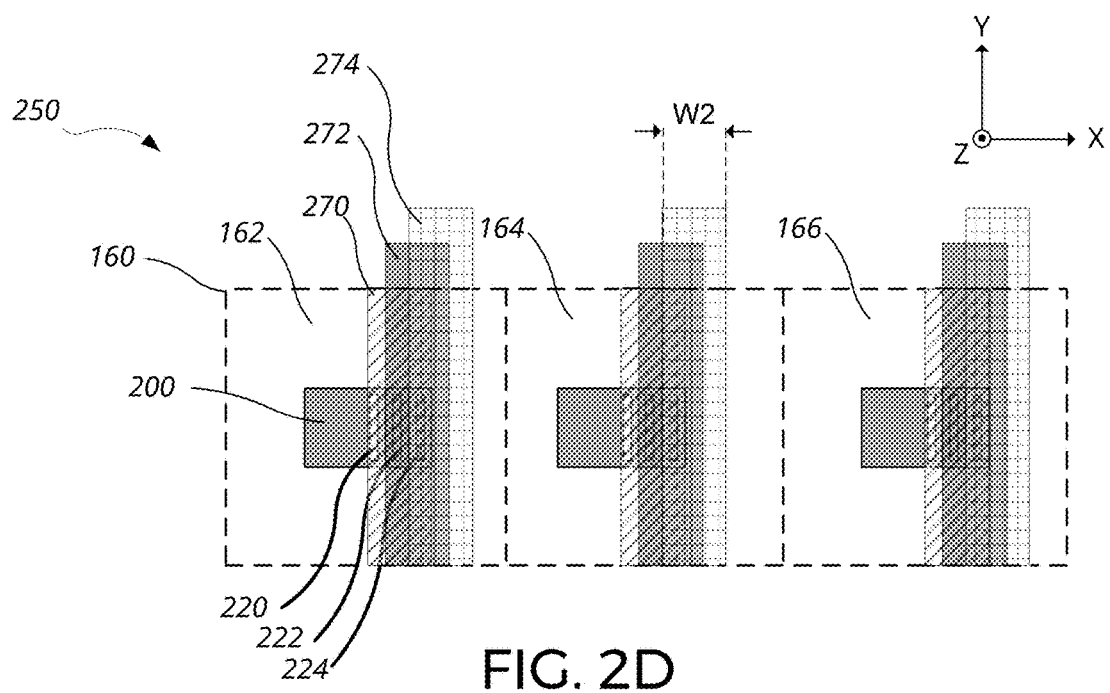
FIG. 2D shows a top view of a portion of an example assembly of the devices with vertically separated terminals.

Referring to FIG. 2D, a top view of a portion of an example assembly 250 of the example devices 200 with vertically separated terminals is shown. The assembly 250 includes the substrate 160, multiple devices 200, first electrodes 270, second electrodes 272, and third electrodes 274. For example, the assembly 250 can be a display device including multiple LED devices 200.

The devices 200 of the assembly 250 are interconnected by the electrodes 270, 272, and 274 that are vertically separated. In this example, the first terminal 220 is in electrical contact with the first electrode 270, the second terminal 222 is in electrical contact with the second electrode 272, the third terminal 224 is in electrical contact with the third electrode 274, and the bottom terminal 218 shown in FIG. 2C is in electrical contact with the bottom electrode. The electrodes have a width W2. In contrast with the assembly 150 of FIG. 1C in which the lateral separation S is needed between the electrodes 170,172, and 174 due to the electrodes being located at the same vertical location, the assembly 250 does not require such lateral separation of the electrodes 270, 272, and 274. The electrical isolation between the electrodes is now provided by the vertical separation of the electrodes 270, 272, and 274 and electrically insulating layers disposed between the electrodes.

The device 200 with vertically separated terminals have various advantages over the device 100 with multiple, laterally separated terminals on the same vertical location. For example, the widths W2 of the electrodes 270, 272, and 274 are no longer bound by the requirement of lateral separation between the electrodes 270, 272, and 274. The electrodes of the assembly 250 can have widths that are significantly larger than the dimensions of the terminals 220, 222, and 224 as only one terminal is located at each top surface of the device 200. In fact, the widths W2 can be larger than the lateral dimensions of the device 200. Such widening of width W2 can lead to reduced resolution requirement on the photolithography of the electrodes, reducing complexities of the manufacturing process.

Additionally, such relaxing of the requirement in width W2 can also allow relaxing of the requirement on placement accuracy of the devices 200, alignment accuracy of the electrodes 270, 272, and 274, or combination thereof. By setting the width W2 to be greater than the combined tolerance in alignment of the electrodes and placement of the devices 200, the probability of making proper electrical contact between the electrodes 270,272, and 274 and respective terminals can be greatly increased, alleviating some of the challenges in manufacturing of the assembly 250. Additionally, the tolerances in alignment and placement can be further reduced by increasing the width W2, which can further decrease manufacturing complexities and lead to reduced manufacturing cost, increased manufacturing yield, or combination thereof.

While example of assemblies populated with light emitting elements such as μLEDs have been described, the device 200 of assembly 250 in general can be various types of devices. Examples of device types include photosensor, voltage driver circuit, current driver circuit, RF circuit, antenna, logic circuit, memory, imaging device, acoustic sensor, spectrometer, ultrasonic sensor, and ultrasonic transducer. For example, the assembly 250 can contain light emitting elements, logic circuits to control the light emitting elements, and memory coupled with the logic circuits. Furthermore, the assembly 250 can contain devices of different types, and each region 162, 164, and 166 of the substrate can contain more than one device to achieve various functionalities.

While assembly 250 of the display-type has been described, the assembly 250 in general can be various devices that include electrical elements distributed across the substrate 160. For example, the assembly 250 can be a RF phased-array transceiver, where each region contains an antenna for receiving and/or transmitting RF signal. Furthermore, each region of the RF phased-array transceiver can include both an antenna and RF circuits such as a power amplifier or a pre amplifier to facilitate transmission and reception of RF signals.

Referring to FIGS. 3A-3H, steps of an example process 400 for manufacturing the assembly 250 having devices 200 with vertically separated terminals is shown. Specifically, referring to FIG. 3A, a bottom electrode layer 310 including one or more bottom electrodes is formed. The bottom electrode layer 310 provides electrical connections to the bottom terminal 218 of the device 200 to be placed on the substrate. The bottom electrode layer can be formed, for example, by a blanket film deposition followed by a patterning step, such as a photolithography step and etching of the film. As another example, the bottom electrode layer 310 can be formed using a patterning step of a lift-off photoresist layer, followed by blanket film deposition step and a lift-off step. As yet another example, the bottom electrode layer 310 can be formed using a patterning step of a photoresist layer, followed by a plating step of the exposed surfaces.

The bottom electrodes can be formed of various conductive materials. Examples of materials for the bottom electrodes include metals, transparent conducting oxide, transparent conducting polymer, graphene, carbon nanotube, and doped silicon. Examples of transparent conducting polymer include Poly(3,4-ethylenedioxythiophene) (PEDOT), PEDOT mixed with polystyrene sulfonate (PEDOT:PSS), and PEDOT-tetramethacrylate (PEDOT-TMA). Examples of metals include aluminum, copper, tin, nickel-tin alloy, and die attach metals. Examples of transparent conducting oxide include indium tin oxide (ITO) and aluminum-doped zinc oxide (AZO). The choice of material for the bottom electrodes can be based on, for example, whether light emitted by the device 200 is to be transmitted through the substrate, in which case a transparent conducting oxide or a transparent conducting polymer may be preferred for improved optical transmission.

Figure 3A:
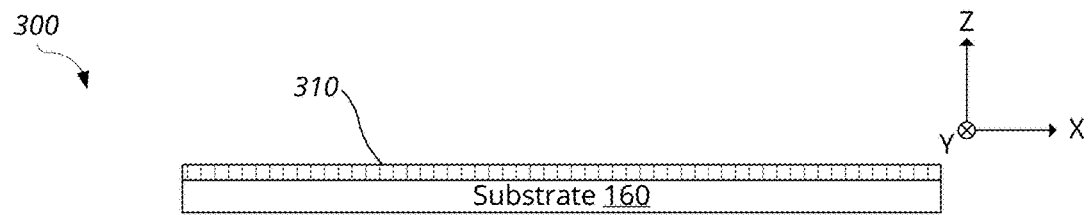
FIGS. 3A-3H show steps of an example process for manufacturing an assembly having devices with vertically separated terminals.
Figure 3B:
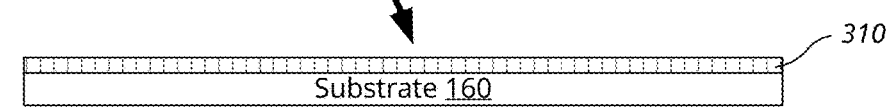

Referring to FIG. 3B, multiple devices 200 are placed on the substrate 160 at different locations. The devices 200 should be placed on the substrate with a lateral placement accuracy that is smaller than the widths of the electrodes to be formed. In other words, the widths of the electrodes to be formed should be larger than the lateral placement accuracy of the devices 200. The devices 200 can be placed on the substrate 160 using various techniques. For example, each device 200 can be sequentially placed by conventional pick-and-place techniques. As another example, two or more devices can be placed at the same time using various parallel transfer techniques. Examples of parallel transfer techniques include transfer printing, which will be described in relation to FIGS. 4A-4B. As yet another example, multiple devices can be placed at the same time using various self-assembly techniques. Examples of self-assembly techniques include fluidic assembly, electric field-assisted fluidic assembly, and surface wettability-based assembly. Examples of self-assembly techniques will be described in relation to FIGS. 5A-6B.

Once the devices 200 have been placed, the devices 200 is mechanically attached to the substrate 160. For example, a solder can be applied on the surface of the substrate or the bottom electrode layer 310 prior to the placement of the devices, and a reflow step can be performed to melt the solder and form a metallic bond between the device 200 and the substrate 160 or the bottom electrode layer 310.

Figure 3C:
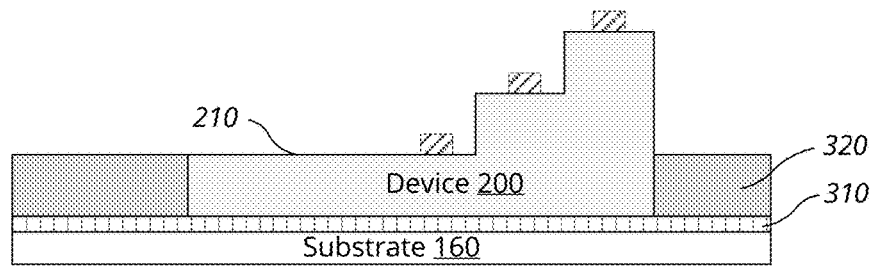

Referring to FIG. 3C, a first electrically insulating layer 320 is formed over the bottom electrode layer 310. The first insulating layer 320 provides electrical insulation between the bottom electrode layer 310 and the subsequent electrode layers to be formed. Examples of materials for the first electrically insulating layer 320 include various dielectric materials such as silicon dioxide, silicon nitride, and silicon oxynitride, spin-on glass, benzocyclobutene (BCB), and SU-8.

The first insulating layer 320 should be disposed between the devices 200, filling in at least a portion of the lateral gaps between the devices 200, and preferably be sufficiently level with the first top surface 210 of the device 200 (e.g., within 10, 25, 50, 100, 200, or 500 nm) to provide a sufficiently planar surface for subsequent processing steps. As such, thickness of the first insulating layer can correspond to the vertical separation between the bottom terminal 218 and the first terminal 220, e.g., between 100 nm to 1 μm. Planarizing property of spin-on glass, for example, can be used to planarize first insulating layer 320. As another example, spin-coating of certain materials, such as spin-on glass, BCB, and SU-8, can fill the lateral gaps and leave a relatively thin layer of material on protrusions, such as portions of the device 200 above the first top surface 210. In such cases, a blanket etch-back step can be performed to remove insulating materials covering portions of the device 200 above the first top surface 210 while retaining most of the first insulating layer 320 between the devices 200. As yet another example, lift-off techniques can be used to selectively leave behind insulating layers between the devices 200.

Figure 3D:
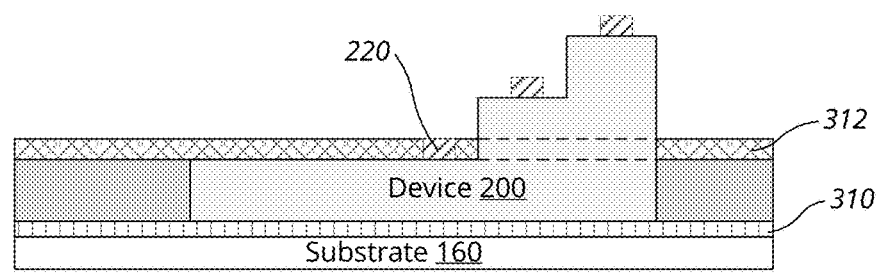

Referring to FIG. 3D, a first electrode layer 312 including one or more first electrodes 270 is formed. The first electrode layer 312 provides electrical connections to the first terminal 220 of the device 200. The first electrode layer can be formed, for example, by a blanket film deposition followed by a patterning step, such as a photolithography step and etching of the film. As another example, the first electrode layer 312 can be formed using a patterning step of a lift-off photoresist layer, followed by blanket film deposition step and a lift-off step. The first electrode layer 312 can be formed using materials described in relation to the bottom electrode layer 310 of FIG. 3A.

Figure 3E:
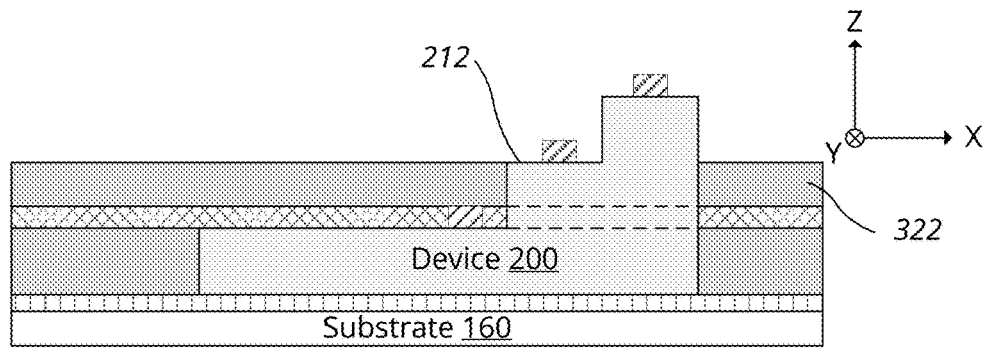

Referring to FIG. 3E, a second electrically insulating layer 322 is formed over the first electrode layer 312. The second insulating layer 322 provides electrical insulation between the first electrode layer 312 and the subsequent electrode layers to be formed. The second insulating layer 322 can be formed as described in relation to FIG. 3C.

Figure 3F:
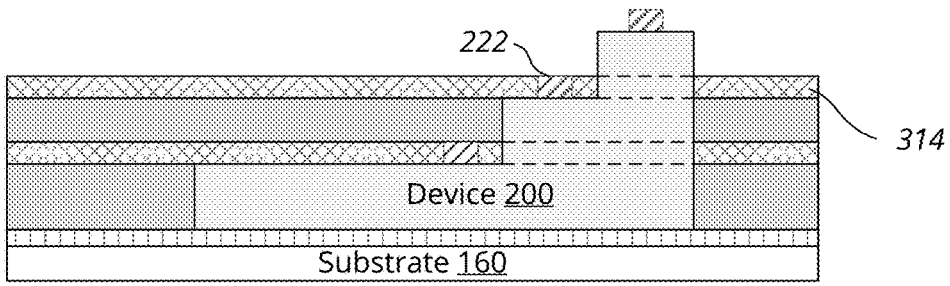

Referring to FIG. 3F, a second electrode layer 314 including one or more second electrodes 272 is formed. The second electrode layer 314 provides electrical connections to the second terminal 222 of the device 200. The second electrode layer 314 can be formed as described in relation to FIG. 3D.

Figure 3G:
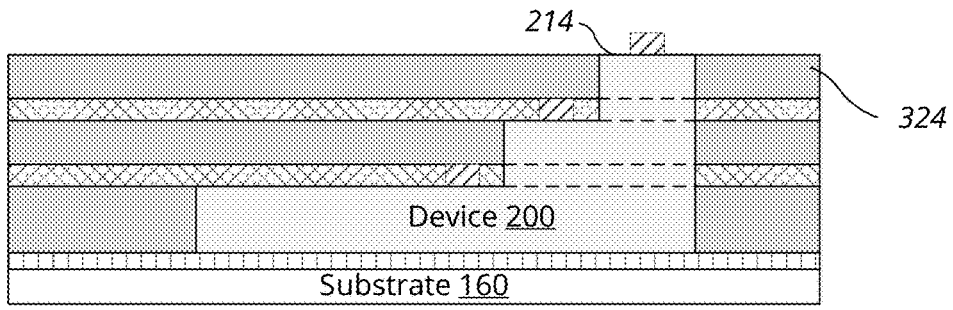

Referring to FIG. 3G, a third electrically insulating layer 324 is formed over the second electrode layer 314. The third insulating layer 324 provides electrical insulation between the second electrode layer 314 and the subsequent electrode layers to be formed. The third insulating layer 324 can be formed as described in relation to FIG. 3C.

Figure 3H:
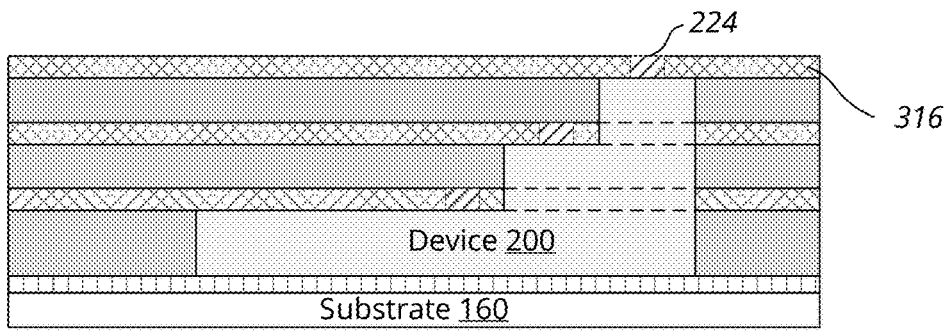

Referring to FIG. 3H, a third electrode layer 316 including one or more third electrodes 274 is formed. The third electrode layer 316 provides electrical connections to the third terminal 224 of the device 200. The third electrode layer 316 can be formed as described in relation to FIG. 3D.

While a bottom electrode layer 310 was formed on the substrate 160 prior to placement of the device 200, in some implementations, this step can be omitted. For example, the substrate 160 can be an active matrix backplane that includes various components of a display device and the bottom electrode layer 310. The active matrix backplane typically includes thin-film-transistors (TFTs) for addressing each pixels of a display. For example, the backplane can include a set of TFTs for each regions 162, 164, and 166 for controlling the μLED device 200.

While individual patterning and etching steps for each of the electrodes layers 312, 314, and 316 have been described, in some implementations, the electrode layers can be deposited without individual patterning steps, followed by a common patterning and etching step.

In general, devices 200 of different types can be placed during the placement step of FIG. 3B. For example, devices such as light emitting elements, photosensors, voltage driver circuits, current driver circuits, RF circuits, antennas, logic circuits, and memories can be placed. For example, a µLED and a current driver circuit to drive the µLED can be placed within each of the regions 162, 164, and 166 of the substrate 160. This type of integration can be used to provide a current needed to drive the µLED, which can exceed the current drive capacity of certain active matrix backplanes.

Some assemblies 250, such as display devices sparsely populated with light emitting elements such as µLEDs, can be made to have a semi-transparent appearance. For example, the substrate 160 can be a transparent substrate, such as a flexible plastic substrate or a glass substrate that transmits a substantial portions of incident visible light (e.g., greater than 95%, 90%, 85%, 80%, 70% or 50%). While some electrical devices, such as µLEDs formed from semiconductors, are typically not transparent to visible light, portions of the substrate that are covered, hence blocking light transmission, can be reduced to allow a substantial portion of incident light to pass through. For example, a single µLED with an area of 100 µm$^2$ can be placed per region with an area of 1000 µm$^2$, resulting in a fill factor of 10%, corresponding to approximately 10% reduction in overall optical transmission through the display device. In general, the fill factor, or the proportion of the combined area of the light emitting elements relative to the substrate 160, can be varied to achieve suitable optical transparency and/or display brightness among other factors. Furthermore, µLEDs having area in the 100-1000's of µm$^2$ range, given sufficient viewing distance from the display, can be visually inconspicuous or remain unresolved to the human vision, providing a transparent appearance to the display. Similarly, the combined area of the electrodes such as the electrodes 270, 272, and 274 can be limited to be a small fraction of the area of the substrate 160 to provide a transparent appearance to the display. Additionally, or alternatively, semi-transparent materials such as transparent conducting oxides, transparent conducting polymers, graphene, and carbon nanotube can be used to increase the optical transmission through the electrode layers. When semi-transparent materials are used to form the electrodes, the area of the electrodes can be increased while maintaining a degree of optical transparency.

Some assemblies 250, such as display devices densely populated with light emitting elements such as µLEDs, can be used as a display device for virtual reality (VR) devices. For example, for a head-mounted display application for VR, the display device is placed in close proximity (e.g., less than 10 cm) of the eyes of the viewer. In such applications where the display is placed in close proximity of the eyes of the viewer, having a high fill factor (e.g., greater than 95%, 90%, 85%, 80%, 70% or 50%) for the assembly 250 may be beneficial. High fill factor can, for example, contribute to an improved viewing experience, and an improved sense of immersion in the VR environment.

A display device typically contains a large number of pixels. For example, a full high-definition (HD) display contains 1920×1080 pixels, for a total of 2,073,600 pixels. Other standards for display resolution, such as 4K UHD, can have significantly more number of pixels, and the number of pixels in a display is expected to increase over time. Even a modestly-sized display device such as a touch screen of a smart phone can contain close to a million pixels, and display devices in general can have pixel counts ranging from 10's of thousands of pixels to 10's of millions of pixels. As such, sequential pick-and-place of elements such as the devices 200 onto the substrate 160 is typically infeasible. Therefore, parallel transfers techniques that can place a large number of devices per operation are desired.

Figure 4A:
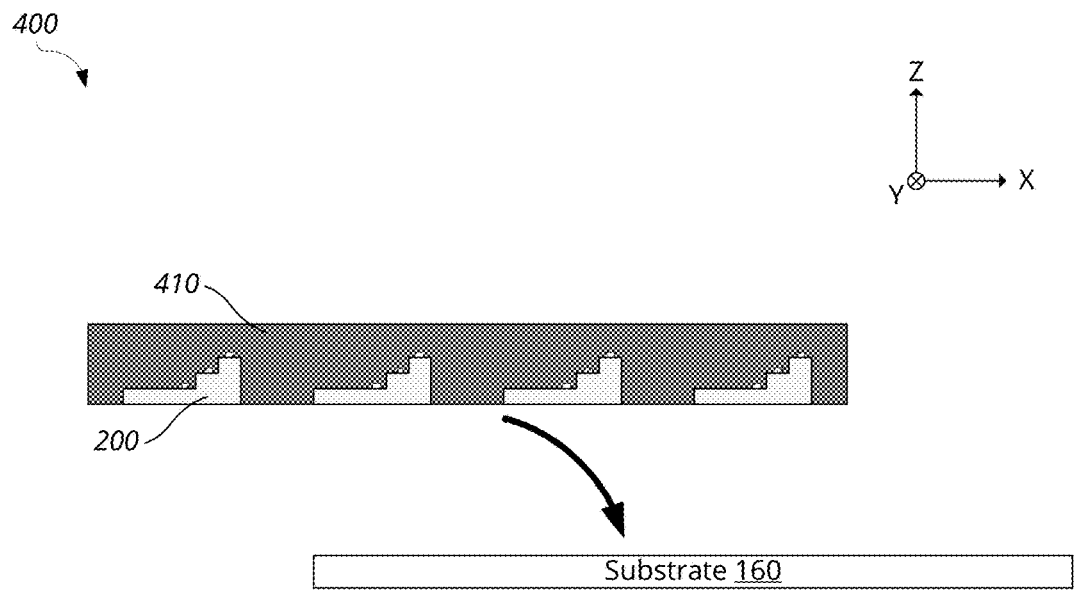
FIGS. 4A-4B show steps of a first example process for placing multiple devices onto a substrate.
Figure 4B:
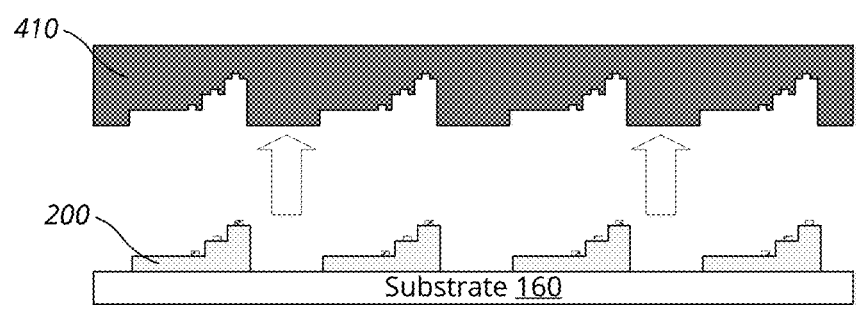

Referring to FIGS. 4A-4B, steps of a first example process 400 for placing multiple devices onto a substrate are shown. The first process 400 involves preparing a transfer stamp 410 populated with multiple devices 200, and transferring those devices 200 onto the substrate 160. As such, the first process 400 may be referred to as "transfer-printing". The transfer stamp 410, for example, can be formed from materials such as polymer and elastomer that can provide temporary adhesion between the transfer stamp 410 and the devices 200 during the transfer-printing process. The transfer stamp 410 can be populated from a source wafer on which the devices 200 are formed, for example, by mechanically contacting the devices 200 on the source wafer with the transfer stamp 410, which can cause the devices 200 to adhere to the devices 200. For example, thousands to tens of thousands of devices 200 can be populated onto the transfer stamp 410 for placement during a single transfer-printing step. The devices 200 can be partially or fully embedded onto the transfer stamp 410, and more generally, the device 200 can adhere to the transfer stamp 410 through a surface, such as the third top surface 214. The source wafer can be processed such that the devices 200 at desired location and/or pitch can be selectively removed from the source wafer.

Referring to FIG. 4A, the populated transfer stamp 410 is brought in contact with the substrate 160 to transfer the devices 200 onto the substrate 160. For example, sequential pick-and-place techniques can be used to place the transfer stamp 410 at a desired location on the substrate 160.

Referring to FIG. 4B, the transfer stamp 410 is removed from the substrate 160 while leaving behind the devices 200 on the substrate 160. For example, once the transfer stamp 410 is brought in contact with the substrate 160, a release step can be performed to release the devices 200 from the transfer stamp 410. Examples of release step include UV irradiation, heating, and compression of the transfer stamp followed by a rapid withdrawing of the transfer stamp. Once the devices 200 have been released from the transfer stamp 410, the transfer stamp is removed from the substrate, completing one transfer-printing step. The process 400 can be repeated until substrate 160 is fully populated with the devices 200.

While illustrations of FIGS. 4A and 4B show devices 200 which are fully embedded in the transfer stamp 410, in general, only a portion of the device 200 may be in contact with the transfer stamp 410. For example, the transfer stamp 410 can have protrusions that are smaller than the device 200 and attach to a flat portion of the device 200. As another example, only the top-most level of the device 200 may be embedded in the transfer stamp 410.

Figure 5A:
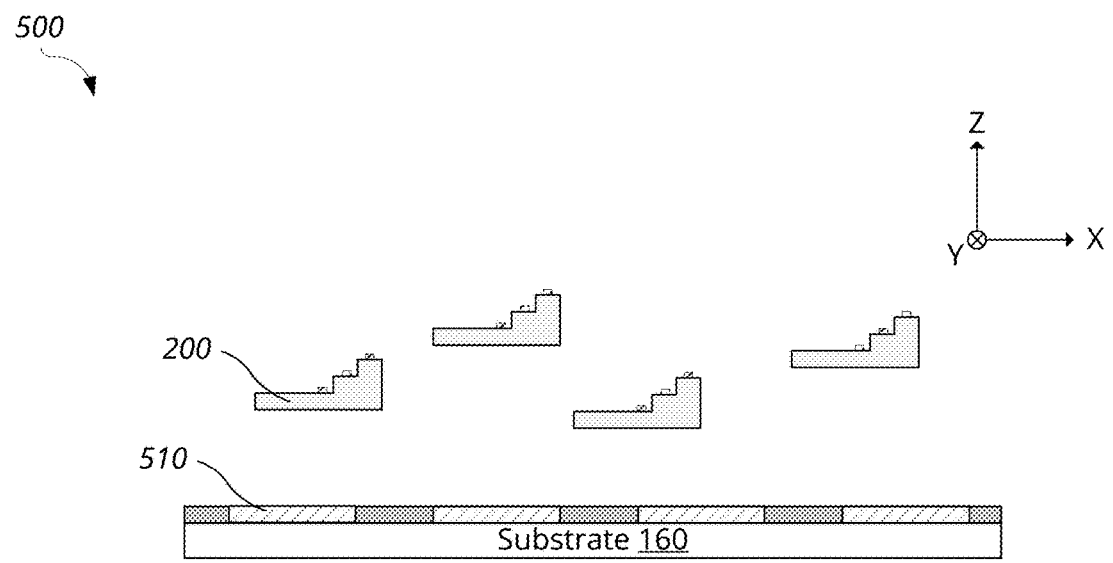
FIGS. 5A-5B show steps of a second example process for placing multiple devices onto a substrate.
Figure 5B:

Referring to FIGS. 5A-5B, steps of a second example process 500 for placing multiple devices onto a substrate are shown. The second process 500 involves dispersing the devices 200 onto the surface of the substrate 160 having multiple assembly sites 510, and allowing the devices 200 to be attracted to, or assembled onto, the assembly sites 510. As such, the second process 500 may be referred to as "self-assembly" process.

Referring to FIG. 5A, the assembly sites 510 provide attractive forces configured to attract and capture the device 200 onto the assembly sites 510. For example, the assembly sites 510 can be electrodes biased to a potential, and the devices 200 or a portion of the devices can be formed to have a positive or negative charge. Referring to FIG. 5B, the assembly sites 510, for example, can be biased to a positive potential when the devices 200 are negatively charged and vice versa, and the resulting electrostatic attraction can lead to self-assembly of the devices 200 on the assembly sites 510. In this example, the substrate 160 and the devices 200 can be placed in a fluidic environment to facilitate movement of the devices caused by the electrostatic forces.

As another example, the assembly sites 510 can be hydrophilic sites populated with a liquid, surrounded by hydrophobic regions. The liquid populated on assembly sites 510 maintains a surface tension, and the surface tension of the liquid can attract the devices 200 onto the assembly sites 510 when the devices 200 come into contact with the liquid, resulting in self-assembly.

The process 500 can be performed over a portion of, or over the entire surface of the substrate 160, allowing for massively-parallel placement of the devices 200 onto the substrate 160.

Figure 6A:
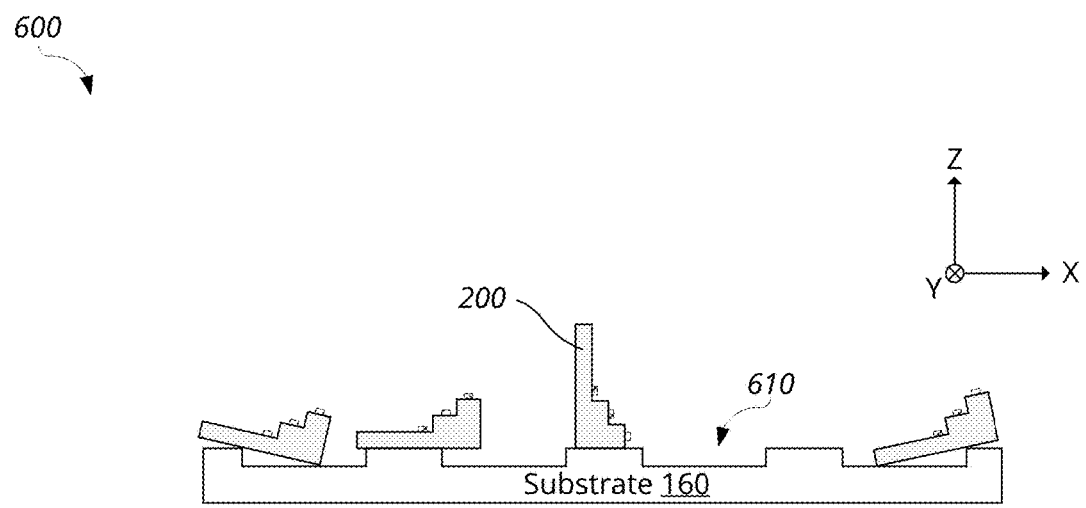
FIGS. 6A-6B show steps of a third example process for placing multiple devices onto a substrate.
Figure 6B:
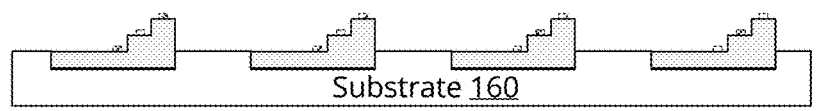

Referring to FIGS. 6A-6B, steps of a third example process 600 for placing multiple devices onto a substrate are shown. The third process 600 involves forming, or providing the substrate 160 having recesses 610 designed to accommodate the devices 200, dispersing the devices 200 across the substrate 160, and mechanically agitating the devices 610 and/or the substrate 160 until the devices fall into the recesses 610 in a correct orientation. Referring to FIG. 6A, the devices 200 are dispersed onto the surface of the substrate 160. When initially dispersed, the devices 200 can have various orientations and may or may not be seated properly within the recesses 610. Referring to FIG. 6B, by mechanically agitating the substrate 160, the devices 200 can randomly move around on the substrate in various orientations until they are seated in the designed orientation of the recesses. Once properly seated in the recesses, the lateral confinement provided by the recesses can secure the devices in place until the remaining devices are seated in the recesses as well. The mechanical agitation can be stopped once all recesses 610 have been populated with devices 200 in their correction orientation, and excess devices 200 can be removed from the surface of the substrate 160. The process 600 can be performed over a portion of, or over the entire surface of the substrate 160, allowing for massively-parallel placement of the devices 200 onto the substrate 160.

Various parallel transfer techniques such as processes 400, 500, and 600 can place the devices 200 onto desired locations on the substrate 160. However, for certain parallel transfer techniques, such as processes 500 and 600, controlling the rotational orientation of the devices 200 may be challenging. Variations in rotational orientations of the devices 200 can lead to challenges in making electrical contacts between the terminals and the electrodes due to changing of location of the terminals with the device orientation. A device having perimeter contacts can help reduce or eliminate a need for rotational alignment of the devices 200.

Figure 7:
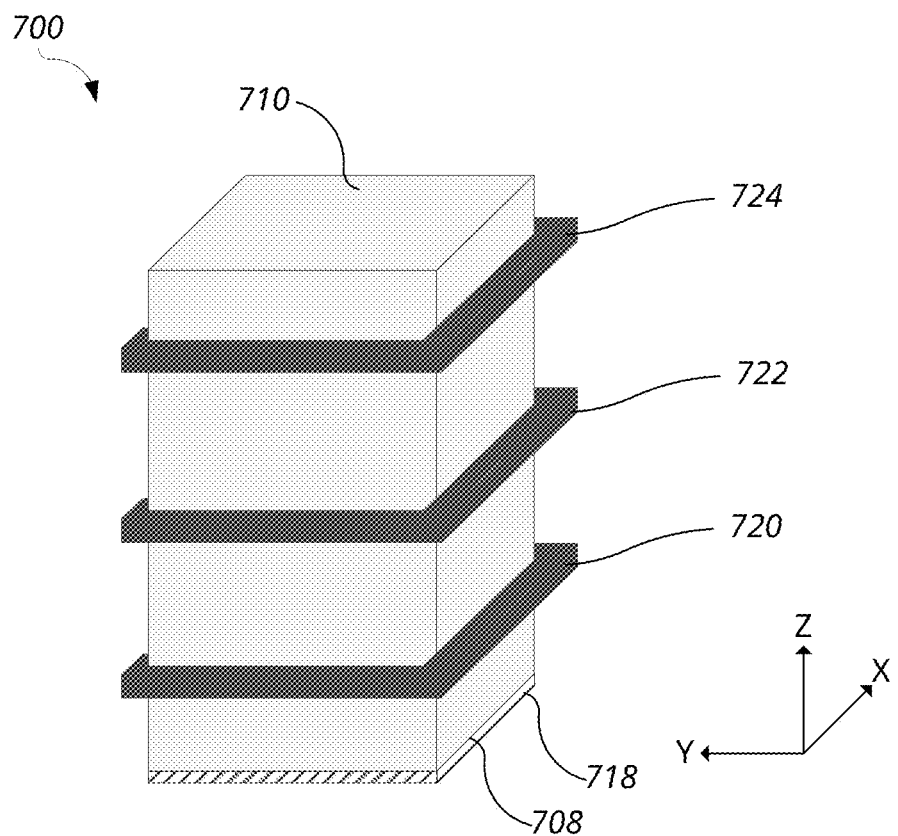
FIG. 7 shows a perspective view of a second example device with vertically separated terminals.

Referring to FIG. 7, a perspective view of a second example device 700 with vertically separated terminals is shown. The device 700 has a bottom surface 708 and a top surface 710, and includes a bottom terminal 718, a first perimeter contact 720, a second perimeter contact 722, and a third perimeter contact 724. For example, the device 700 can be a light emitting element, such as a μLED. The top surface 710 and the bottom surface 708 are generally parallel to one another, and are parallel to the x-y plane in this example. The plane encompassing the bottom surface may be referred to as a "common plane". The top surface 710, for example, can be a light emitting surface. Additionally, or alternatively, the bottom surface 208 can be a light emitting surface.

The first, second, and third perimeter contacts 720, 722, and 724 are located along the first, second, and third vertical locations. Specifically, the perimeter contacts 720, 722, and 724 are vertically separated along the z-axis. The vertical separation between adjacent pairs of the perimeter contacts can range, for example, between 100 nm to 10 μm. As another example, the vertical separation between adjacent pairs of top surfaces can be a fraction of the height H of the device 700, such as H/2, H/4, or H/8. The perimeter contacts 720, 722, and 724 are in electrical contact with different portions of the device 700, and can apply an electrical voltage, provide charge carriers, or combination thereof to different portions of the device 700. The different portions can correspond to, among others, different circuits, different components of the device, and different layers contained in the device 700. For example, the perimeter contacts 720, 722, and 724 can be anodes of three LEDs included in the device 700 emitting light at three different wavelengths, such as red, green, and blue, and the bottom terminal 718 can be a shared cathode for the three LEDs. By providing charge carriers to the LEDs of the device 700, light can be generated.

The device 700 having perimeter contacts can be used in analogous manner as the device 200 having vertically separated terminals in assembling the assembly 250. However, due to the perimeter contacts being formed around the entire perimeter of the device 700, electrical contacts can be made between the electrodes such as the electrodes 270, 272, and 274 and the perimeter contacts regardless of the rotational orientation of the device 700, which can be advantageous in reducing process complexity in assembling the assembly 250. Furthermore, in the case of a μLED device, relocating the contacts from the top surface 710 to the perimeter of the device increases the portion of the top surface 710 that can be used as a light emitting surface. As such, the μLED can be made smaller compared to a device having contacts located on the top surface.

The perimeter contacts 720, 722, and 724 can be formed, for example, using multiple metal electroplating steps (e.g., copper electroplating). As another example, a process involving forming a stack of lift-off resist and photoresist followed by exposure and development of the stacked resist can be used to create rings of resists that are separated in the vertical direction. Metal can be deposited conformally over the resist rings, which can then be lifted off to leave peripheral rings of conductors that are inverse-image of the photoresist rings.

A number of embodiments have been described. Nevertheless, it will be understood that various modifications may be made without departing from the spirit and scope of the invention. Accordingly, other embodiments are within the scope of the claims.

What is claimed is:
1. A light emitting device, comprising:
a plurality of light emitting elements arranged at different locations in a common plane, each light emitting element comprising:
at least one layer of a semiconductor material;
a first electrical terminal for providing charge carriers to a first portion of the light emitting element, the first electrical terminal being located at a first location along an axis perpendicular to the common plane;
a second electrical terminal for providing charge carriers to a second portion of the light emitting element, the second electrical terminal being located at a second location along the axis perpendicular to the common plane different from the first location; and a third electrical terminal for providing charge carriers to a third portion of the light emitting element, the third electrical terminal being located at a third location along the axis perpendicular to the common plane different from the first and second locations;

a first electrode layer comprising one or more electrodes each being in electrical contact with the first electrical terminal of one or more of the plurality of light emitting elements;

a second electrode layer comprising one or more electrodes each being in electrical contact with the second electrical terminal of one or more of the plurality of light emitting elements;

a third electrode layer comprising one or more electrodes each being in electrical contact with the third electrical terminal of one or more of the plurality of light emitting elements;

a first electrically insulating layer disposed between the plurality of light emitting elements and also disposed between the first and second electrode layers along the axis perpendicular to the common plane; and a second electrically insulating layer disposed between the plurality of light emitting elements and also disposed between the second and third electrode layers along the axis perpendicular to the common plane.

2. The light emitting device of claim 1, wherein the first electrical terminal, the second electrical terminal, and the third electrical terminal are contacts that do not spatially overlap when projected onto the common plane.

3. The light emitting device of claim 1, wherein the first electrical terminal, the second electrical terminal, and the third electrical terminal are perimeter contacts that cover at least a portion of a sidewall of the light emitting element.

4. The light emitting device of claim 1, wherein at least one of the one or more electrodes of the first electrode layer, second electrode layer, or the third electrode layer is a transparent electrode.

5. The light emitting device of claim 4, wherein the transparent electrode is formed from a material selected from the group consisting of a transparent conducting oxide, transparent conducting polymer, graphene, and carbon nanotube.

6. The light emitting device of claim 1, wherein the first location, the second location, and the third location adjacent to one another along the axis perpendicular to the common plane are separated from one another by 1000 nm or less along the axis.

7. The light emitting device of claim 1, further comprising:

an active matrix backplane supporting the plurality of light emitting elements, the first electrode layer, the second electrode layer, the third electrode layer, the first electrically insulating layer, and the second electrically insulating layer.

8. The light emitting device of claim 7, wherein a total area of the plurality of light emitting elements in the common plane is equal to or less than 15% of an area of the active matrix backplane.

9. The light emitting device of claim 1, wherein the plurality of light emitting elements comprises at least 10,000 light emitting elements.

10. The light emitting device of claim 1, wherein the one or more electrodes of the first electrode layer, second electrode layer, and the third electrode layer have widths larger than dimensions of the light emitting elements in the common plane.

11. The light emitting device of claim 1, further comprising:

a plurality of non-light emitting elements arranged at different locations in the common plane, the plurality of non-light emitting elements comprising at least one of photosensor, voltage driver circuit, current driver circuit, logic circuit, memory, imaging device, acoustic sensor, spectrometer, ultrasonic sensor, or ultrasonic transducer.

* * * * *